(12) United States Patent
Kiyama et al.

(10) Patent No.: US 10,837,124 B2
(45) Date of Patent: **\*Nov. 17, 2020**

(54) GALLIUM NITRIDE SUBSTRATE (71) Applicant: SUMITOMO ELECTRIC INDUSTRIES, LTD., Osaka (JP)

(72) Inventors: Makoto Kiyama, Itami (JP); Ryu Hirota, Itami (JP); Seiji Nakahata, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/571,599

(22) Filed: Sep. 16, 2019

(65) Prior Publication Data

US 2020/0032419 A1 Jan. 30, 2020

Related U.S. Application Data (63) Continuation of application No. 15/319,076, filed as application No. PCT/JP2015/061197 on Apr. 10, 2015, now Pat. No. 10,458,043.

(30) Foreign Application Priority Data

Jul. 24, 2014 (JP) .................. 2014-150845

(51) Int. Cl.
*C30B 29/64* (2006.01)
*B32B 9/00* (2006.01)
(Continued)

(52) U.S. Cl.
CPC ............ *C30B 29/406* (2013.01); *C30B 25/02* (2013.01); *C30B 29/64* (2013.01)

(58) Field of Classification Search
None
See application file for complete search history.

(56) References Cited

U.S. PATENT DOCUMENTS

2007/0145376 A1 6/2007 Okui et al.
2008/0202409 A1 8/2008 Motoki et al.
(Continued)

FOREIGN PATENT DOCUMENTS

CN 102308032 A 1/2012
JP 2005-322944 A 11/2005
(Continued)

OTHER PUBLICATIONS

H. Harima, "Characterization of GaN and Related Nitrides by Raman Scattering", Journal of the Society of Material Science, Japan, vol. 51, No. 9, Sep. 2002, pp. 983-988.
(Continued)

*Primary Examiner* — Humera N. Sheikh
*Assistant Examiner* — Mary I Omori
(74) *Attorney, Agent, or Firm* — Faegre Drinker Biddle & Reath LLP (57) ABSTRACT

A gallium nitride substrate has a surface with a diameter of not less than 100 mm, a difference being not less than 0.1 $cm^{-1}$ and not more than 2 $cm^{-1}$ between maximum and minimum values of wave numbers at a maximum peak of peaks corresponding to an $E_2^H$ phonon mode in micro-Raman scattering mapping measurement at each of square regions having sides each having a length of 2 mm, the square regions being located at a total of five locations including a central location and four circumferential edge locations on the surface of the gallium nitride substrate, a difference being not more than 2 $cm^{-1}$ between maximum and minimum values of the wave numbers at the maximum
(Continued)

peak of the peaks corresponding to the $E_2^H$ phonon mode at all of measurement points in the five locations.

5 Claims, 6 Drawing Sheets

(51) Int. Cl.
*C30B 29/40* (2006.01)
*C30B 25/02* (2006.01)

(56) References Cited

U.S. PATENT DOCUMENTS

| | | |
|---|---|---|
| 2011/0315997 A1 | 12/2011 | Hachigo |
| 2013/0029472 A1 | 1/2013 | Park et al. |

FOREIGN PATENT DOCUMENTS

| | | |
|---|---|---|
| JP | 2006-066496 A | 3/2006 |
| JP | 2007-169132 A | 7/2007 |
| JP | 2011-135019 A | 7/2011 |
| JP | 2015-044707 A | 3/2015 |

OTHER PUBLICATIONS

K. Motoki, "Development of GaN Substrates", SEI technical review, vol. 175, Jul. 2009, pp. 10-18.

GALLIUM NITRIDE SUBSTRATE

TECHNICAL FIELD

The present invention relates to a gallium nitride (GaN) substrate.

BACKGROUND ART

Among nitride semiconductor substrates, GaN substrates have been drawing attention as substrates for manufacturing semiconductor devices such as a light emitting device and an electronic device. However, at present, for manufacturing of a GaN substrate, growth has to be performed on a heterogeneous substrate. Since lattice constant and thermal expansion coefficient are different between the heterogeneous substrate and the GaN crystal, a multiplicity of crystal defects are generated in the GaN crystal, disadvantageously.

To address this, for example, Non-Patent Document 1 discloses a GaN substrate, wherein a GaN crystal provided with a multiplicity of dot-shaped depressions in its surface is grown such that crystal defects are located intensively at the centers of the depressions in the GaN crystal and crystal defects are reduced around the depressions.

CITATION LIST

Non Patent Document

NPD 1: Kensaku Motoki, "Development of GaN Substrates", SEI technical review, Vol. 175, July, 2009, pp. 10-18

NPD 2: Hiroshi Harima, "Characterization of GaN and Related Nitrides by Raman Scattering", Journal of the Society of Material Science, Japan, Vol. 51, No. 9, September, 2002, pp. 983-988

SUMMARY OF INVENTION

Technical Problem

However, improvement has been required because such a GaN substrate may be cracked or broken when manufacturing a semiconductor device by epitaxially growing another semiconductor layer on the GaN substrate.

Solution to Problem

A GaN substrate according to one embodiment of the present invention is a GaN substrate having a surface with a diameter of not less than 100 mm, a difference being not less than 0.1 cm$^{-1}$ and not more than 2 cm$^{-1}$ between maximum and minimum values of wave numbers at a maximum peak of peaks corresponding to an $E_2^H$ phonon mode in micro-Raman scattering mapping measurement at each of square regions having sides each having a length of 2 mm, the square regions being located at a total of five locations including a central location and four circumferential edge locations on the surface of the GaN substrate, a difference being not more than 2 cm$^{-1}$ between maximum and minimum values of the wave numbers at the maximum peak of the peaks corresponding to the $E_2^H$ phonon mode at all of measurement points in the five locations.

A bonded substrate according to one embodiment of the present invention is a bonded substrate in which the GaN substrate is bonded to a supporting substrate.

Advantageous Effects of Invention

According to the description above, occurrence of crack and breakage can be suppressed when epitaxially growing another semiconductor layer.

BRIEF DESCRIPTION OF DRAWINGS

Each of FIG. 2A to FIG. 2D is a schematic cross sectional view illustrating an exemplary method for manufacturing the GaN substrate of the first embodiment.

DESCRIPTION OF EMBODIMENTS

Description of Embodiments of the Present Invention

First, embodiments of the present invention are listed and described.

(1) A GaN substrate according to one embodiment of the present invention is a GaN substrate having a surface with a diameter of not less than 100 mm, a difference being not less than 0.1 cm$^{-1}$ and not more than 2 cm$^{-1}$ between maximum and minimum values of wave numbers at a maximum peak of peaks corresponding to an $E_2^H$ phonon mode in micro-Raman scattering mapping measurement at each of square regions having sides each having a length of 2 mm, the square regions being located at a total of five locations including a central location and four circumferential edge locations on the surface of the GaN substrate, a difference being not more than 2 cm$^{-1}$ between maximum and minimum values of the wave numbers at the maximum peak of the peaks corresponding to the $E_2^H$ phonon mode at all of measurement points in the five locations. With such a configuration, occurrence of crack and breakage can be suppressed when epitaxially growing another semiconductor layer on the GaN substrate having the surface with a diameter of not less than 100 mm.

(2) Preferably in the GaN substrate according to one embodiment of the present invention, the diameter is not less than 150 mm, the difference is not less than 0.1 cm$^{-1}$ and not more than 1 cm$^{-1}$ between the maximum and minimum values of the wave numbers at the maximum peak of the peaks corresponding to the $E_2^H$ phonon mode in the micro-Raman scattering mapping measurement at each of the square regions having the sides each having a length of 2 mm, the square regions being located at the total of five locations including the central location and the four circumferential edge locations on the surface of the GaN substrate, and the difference is not more than 1 cm$^{-1}$ between the maximum and minimum values of the wave numbers at the maximum peak of the peaks corresponding to the $E_2^H$ phonon mode at all of the measurement points in the five locations. With such a configuration, occurrence of crack and breakage can be suppressed when epitaxially growing another semiconductor layer on the GaN substrate having the surface with a diameter of not less than 150 mm.

(3) Preferably in the GaN substrate according to one embodiment of the present invention, each of the square regions having the sides each having a length of 2 mm on the surface of the GaN substrate includes: a region having a threading dislocation density of not less than $1\times10^6$ cm$^{-2}$; and a region having a threading dislocation density of less than $1\times10^6$ cm$^{-2}$. In this case, dislocations are gathered in the region having a threading dislocation density of not less than $1\times10^6$ cm$^{-2}$, thereby improving crystallinity in the region having a threading dislocation density of less than $1\times10^6$ cm$^{-2}$.

(4) Preferably in the GaN substrate according to one embodiment of the present invention, each of the square regions having the sides each having a length of 2 mm on the surface of the gallium nitride substrate includes: a region having an oxygen concentration of not less than $5\times10^{17}$ cm$^{-3}$; and a region having an oxygen concentration of less than $5\times10^{17}$ cm$^{-3}$.

(5) The GaN substrate according to one embodiment of the present invention is a bonded substrate in which the above-described GaN substrate is bonded to a supporting substrate. With such a configuration, occurrence of crack and breakage can be suppressed when epitaxially growing another semiconductor layer.

DETAILS OF EMBODIMENTS OF THE PRESENT INVENTION

Hereinafter, the embodiments will be described. It should be noted that the same reference characters indicate the same or equivalent portions in the figures used for description of the embodiments.

First Embodiment

GaN Substrate

Figure 1:
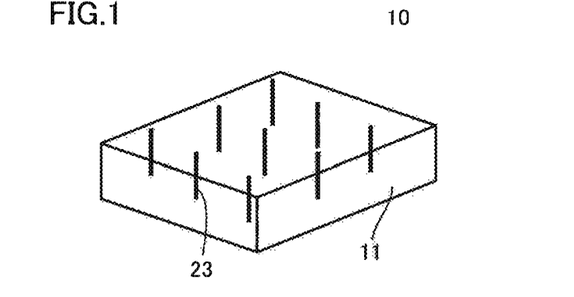
FIG. 1 is a schematic perspective view of a GaN substrate of a first embodiment.

FIG. 1 shows a schematic perspective view of a portion of a surface of a GaN substrate of a first embodiment. A GaN substrate 10 of the first embodiment is composed of a GaN crystal 11. Regions having threading dislocations 23 intensively located therein are formed to extend from a surface of GaN crystal 11 toward inside of GaN crystal 11.

Method for Manufacturing GaN Substrate

Figure 2A:
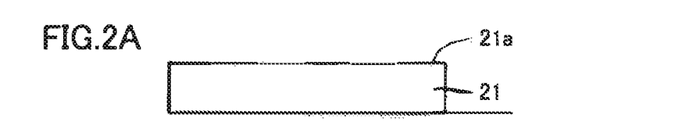

With reference to schematic cross sectional views of FIG. 2A to FIG. 2D, the following describes an exemplary method for manufacturing the GaN substrate of the first embodiment. First, as shown in FIG. 2A, a growth substrate 21 is prepared which has a surface 21a to serve as a growth surface. Growth substrate 21 is not particularly limited as long as GaN crystal 11 can be grown on surface 21a. Examples of growth substrate 21 may include: a heterogeneous substrate such as gallium arsenide (GaAs); and a homogeneous substrate composed of GaN.

Figure 2B:
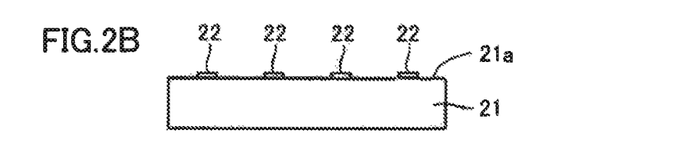

Next, as shown in FIG. 2B, a patterning layer 22 is formed on a surface 21a of growth substrate 21. Patterning layer 22 can be formed by: forming a silicon oxide (SiO$_2$) film through plasma CVD (Chemical Vapor Deposition) on the entire surface 21a of growth substrate 21; forming a resist patterned through photolithography on the SiO$_2$ film; and performing etching using the resist as an etching mask, for example.

Figure 2C:
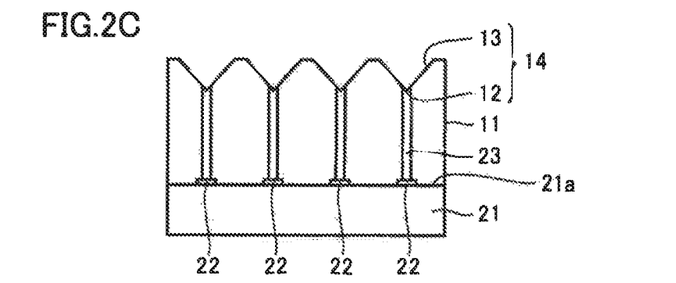

Next, as shown in FIG. 2C, GaN crystal 11 is grown on surface 21a of growth substrate 21 having patterning layer 22 formed thereon. GaN crystal 11 can be grown through HVPE (Hydride Vapor Phase Epitaxy) in which metallic Ga is used as a gallium (Ga) source material and ammonia (NH$_3$) gas is used as a nitrogen (N) source material, for example.

Figure 2D:
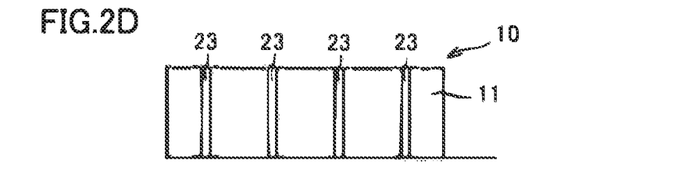

Next, as shown in FIG. 2D, growth substrate 21 on the backside of GaN crystal 11 is removed by grinding or the like, for example. Then, for example, the surface of GaN crystal 11 is planarized by grinding or the like, and then is polished, thus obtaining GaN substrate 10 of the first embodiment.

Figure 2E:
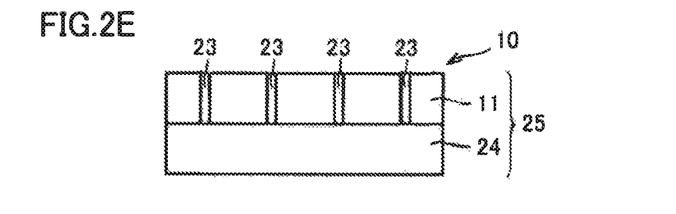
FIG. 2E is a schematic cross sectional view of an exemplary bonded substrate of the first embodiment.

Moreover, for example, as shown in a schematic cross sectional view of FIG. 2E, a heterogeneous substrate 24 can be bonded onto the surface of the obtained GaN substrate 10 of the first embodiment from which growth substrate 21 has been removed, thereby producing a bonded substrate 25. Examples of heterogeneous substrate 24 can include a sapphire substrate, an MN substrate, a SiC substrate, a GaAs substrate, a ZrB$_2$ substrate, a SiO$_2$/Al$_2$O$_3$ sintered compact substrate, a Mo substrate, and the like.

Moreover, the method for bonding GaN substrate 10 of the first embodiment to heterogeneous substrate 24 is not particularly limited; however, it is preferable to use a surface activation method or a fusion bonding method in order to bond them together uniformly at a low temperature, for example. Here, the surface activation method refers to a method for bonding them together after exposing the bonding surface of GaN substrate 10 to plasma to activate the bonding surface, whereas the fusion bonding method refers to a method for bonding them together by heating respective washed surfaces (bonding surfaces) under a pressure. Moreover, GaN substrate 10 of the first embodiment can be bonded to heterogeneous substrate 24 with a joining film interposed therebetween.

Δkp (2 mm□) and Δkp (Entire Surface)

Figure 3:
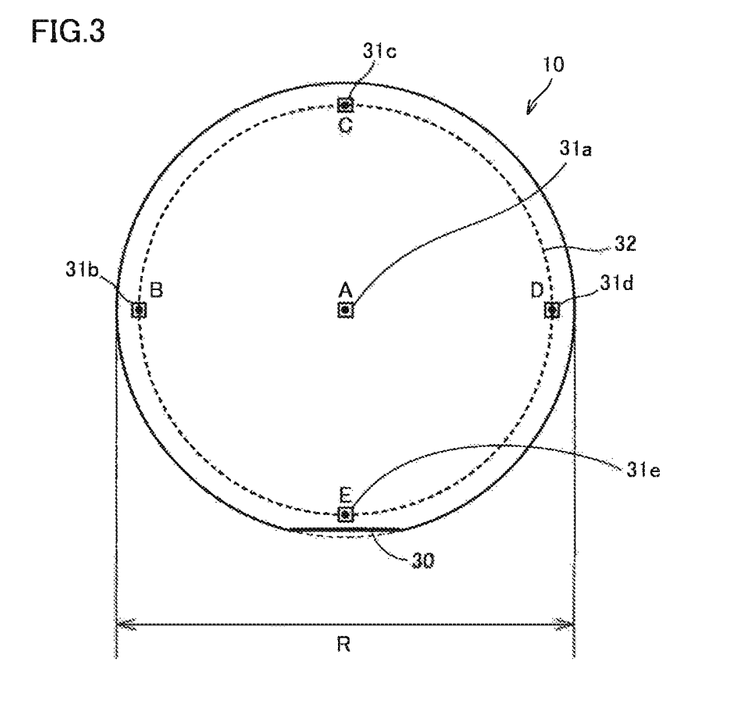
FIG. 3 is a schematic plan view of an exemplary entire surface of the GaN substrate of the first embodiment.

FIG. 3 shows a schematic plan view of an exemplary entire surface of GaN substrate 10 of the first embodiment. The surface of GaN substrate 10 of the first embodiment has a diameter R of not less than 100 mm Diameter R of the surface of GaN substrate 10 refers to the diameter of an imaginary circle assuming that no orientation flat 30 is formed in GaN substrate 10 even though orientation flat 30 is formed in GaN substrate 10.

Moreover, a difference (Δkp (2 mm□)) is not less than 0.1 cm$^{-1}$ and not more than 2 cm$^{-1}$ between maximum and minimum values of wave numbers at a maximum peak of peaks corresponding to an $E_2^H$ phonon mode in Raman spectra obtained through micro-Raman scattering mapping measurement in a 2 mm□ plane, i.e., in each of square regions (regions 31a, 31b, 31c, 31d, 31e) having sides each having a length of 2 mm, the square regions having respective centers located at a total of five points including a central point A and circumferential edge points B, C, D, and E in GaN substrate 10.

Further, a difference (Δkp (entire surface)) is not more than 2 cm$^{-1}$ between maximum and minimum values of wave numbers at the maximum peak of the peaks corresponding to the $E_2^H$ phonon mode in the Raman spectra at all of measurement points in regions 31a, 31b, 31c, 31d, 31e.

Methods for Determining Δkp (2 mm□) and Δkp (Entire Surface)

The following describes methods for determining Δkp (2 mm□) and Δkp (entire surface).

<<Specifying Measurement Regions>>

First, regions 31a, 31b, 31c, 31d, 31e described above are specified as follows. Central point A on the surface of GaN substrate 10 is specified as the point of center of the circle of the surface of GaN substrate 10 (center of the imaginary circle assuming that no orientation flat 30 is formed when orientation flat 30 is formed in GaN substrate 10). Then, assuming that point A thus specified is an intersection of diagonal lines, region 31a is defined as a square region having: two sides constituted of two line segments having a length of 2 mm and parallel to orientation flat 30 shown in FIG. 3; and two sides constituted of two line segments having a length of 2 mm and perpendicular to orientation flat 30.

On the other hand, circumferential edge points B, C, D, and E on the surface of GaN substrate 10 are specified as points on the circumference of an imaginary circle 32 inwardly of, by 5 mm, the outer circumference of the circle (imaginary circle assuming that no orientation flat 30 is formed when orientation flat 30 is formed in GaN substrate 10) constituting of the outer circumference of the surface of GaN substrate 10. Circumferential edge points B, C, D, and E are in such a relation that points B, A, and D are on one straight line, points C, A, and E are on one straight line, and the straight line connecting points B, A, D to one another is orthogonal to the straight line connecting points C, A, E to one another. Then, assuming that each of points B, C, D, and E is an intersection of diagonal lines, each of regions 31b, 31c, 31d, 31e is defined as a square region having: two sides constituted of line segments having a length of 2 mm, parallel to orientation flat 30 and parallel to each other; and two sides constituted of two line segments having a length of 2 mm, perpendicular to orientation flat 30, and parallel to each other.

<<Determination of Δkp (2 mm□)>>

Next, micro-Raman scattering mapping measurement is performed at a plurality of locations in region 31a specified as above to measure Raman spectra at the respective locations within the 2 mm□ plane of region 31a, thereby specifying peaks corresponding to the $E_2^H$ phonon mode at the locations within the 2 mm□ plane of region 31a. Accordingly, the values of the wave numbers (corresponding to Raman shift amounts in cm$^{-1}$) at the maximum peak of the peaks are specified at the locations. Then, maximum value (a1) and minimum value (a2) are specified from the wave numbers specified at the locations within the 2 mm□ plane. Then, a difference (a1−a2) is determined between the maximum value (a1) and the minimum value (a2) of the wave numbers specified as described above, thereby determining Δkp (2 mm□) within the 2 mm□ plane of region 31a.

Δkp (2 mm□) of region 31b can be also determined in a manner similar to the determination of Δkp (2 mm□) of region 31a, i.e., can be determined by: performing micro-Raman scattering mapping measurement to measure Raman spectra at a plurality of locations in region 31b; specifying values of wave numbers at the maximum peak of the peaks corresponding to the $E_2^H$ phonon mode; and determining a difference (b1−b2) between maximum value (b1) and minimum value (b2) of the wave numbers as specified from the values of the wave numbers.

Δkp (2 mm□) of region 31c can be also determined in a manner similar to the determination of Δkp (2 mm□) of region 31a, i.e., can be determined by: performing micro-Raman scattering mapping measurement to measure Raman spectra at a plurality of locations in region 31c; specifying values of wave numbers at the maximum peak of the peaks corresponding to the $E_2^H$ phonon mode; and determining a difference (c1−c2) between maximum value (c1) and minimum value (c2) of the wave numbers as specified from the values of the wave numbers.

Δkp (2 mm□) of region 31d can be also determined in a manner similar to the determination of Δkp (2 mm□) of region 31a, i.e., can be determined by: performing micro-Raman scattering mapping measurement to measure Raman spectra at a plurality of locations in region 31d; specifying values of wave numbers at the maximum peak of the peaks corresponding to the $E_2^H$ phonon mode; and determining a difference (d1−d2) between maximum value (d1) and minimum value (d2) of the wave numbers as specified from the values of the wave numbers.

Δkp (2 mm□) of region 31e can be also determined in a manner similar to the determination of Δkp (2 mm□) of region 31a, i.e., can be determined by: performing micro-Raman scattering mapping measurement to measure Raman spectra at a plurality of locations in region 31e; specifying values of wave numbers at the maximum peak of the peaks corresponding to the $E_2^H$ phonon mode; and determining a difference (e1−e2) between maximum value (e1) and minimum value (e2) of the wave numbers as specified from the values of the wave numbers.

<<Determination of Δkp (Entire Surface)>>

Next, the maximum value (X1) of the wave numbers is specified from maximum values a1, b1, c1, d1, e1 of the wave numbers in regions 31a, 31b, 31c, 31d, 31e. Likewise, the minimum value (X2) of the wave numbers is specified from minimum values a2, b2, c2, d2, e2 of the wave numbers in regions 31a, 31b, 31c, 31d, 31e. Then, a difference (X1−X2) between the maximum value (X1) of the wave numbers and the minimum value (X2) of the wave numbers is determined, thereby determining Δkp (entire surface).

$E2^H$ Phonon Mode

Figure 4:
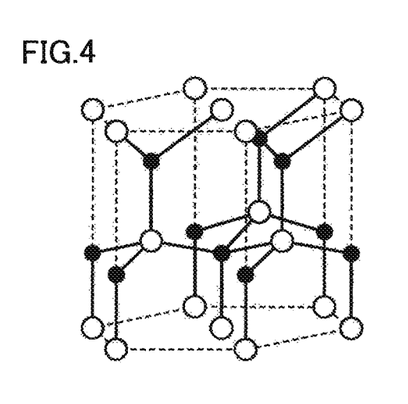
FIG. 4 shows a crystal structure of a wurtzite type GaN crystal.
Figure 5:
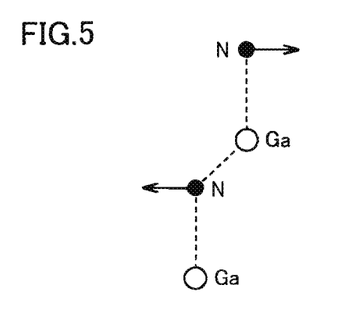
FIG. 5 illustrates an $E2^H$ phonon mode.

Regarding the $E2^H$ phonon mode, the following describes a wurtzite type GaN crystal as an example. The $E2^H$ phonon mode is such a mode that N atoms are displaced in a C plane as shown in FIG. 5 in a GaN crystal having a crystal structure including Ga atoms (white dots) and N atoms (black dots) shown in FIG. 4.

Moreover, as described above, a Raman shift amount corresponding to the $E2^H$ phonon mode is specified in accordance with a wave number at the maximum peak of peaks corresponding to the $E2^H$ phonon mode in a Raman shift spectrum obtained through micro-Raman scattering mapping measurement. It should be noted that Table II on page 985 of Non-Patent Document 2 illustrates 567.6 cm$^{-1}$ as a wave number for the $E2^H$ phonon mode in a wurtzite type GaN crystal at a temperature of 300 K. A Raman spectrum diagram of FIG. 3 of Non-Patent Document 2 shows that a wave number at the maximum peak of peaks corresponding to the $E2^H$ phonon mode is around 567.6 cm$^{-1}$.

Function and Effect

As described above, the $E_2^H$ phonon mode is scattered light in relation with such a mode that adjacent N atoms in the GaN crystal oscillate in an in-plane direction within a C plane (see Non-Patent Document 2). When compressive strain is generated in the C plane, the phonon frequency of the oscillation becomes high, resulting in a high wave number at the maximum peak of the peaks corresponding to the $E_2^H$ phonon mode. On the other hand, when tensile strain is generated in the C plane, the phonon frequency of the oscillation becomes low, resulting in a low wave number at the maximum peak of the peaks corresponding to the $E_2^H$ phonon mode. When the compressive strain or the tensile strain becomes too large locally (microscopically) or entirely (macroscopically) in the GaN substrate, the GaN substrate is likely to be cracked or broken when epitaxially growing another semiconductor layer on the GaN substrate. Hence, it is more preferable that the wave number (corresponding to the Raman shift amount (magnitude of strain)) at the maximum peak of the peaks corresponding to the $E_2^H$ phonon mode in the GaN substrate is smaller both microscopically and macroscopically.

In GaN substrate 10 of the first embodiment, the difference (Δkp (2 mm□)) is not less than 0.1 cm$^{-1}$ and not more than 2 cm$^{-1}$ between the maximum and minimum values of the Raman shift amounts corresponding to the $E_2^H$ phonon mode in the Raman spectra obtained through the micro-Raman scattering mapping measurement in each of square regions 31a, 31b, 31c, 31d, 31e having sides each having a length of 2 mm, the square regions having respective centers at a total of five points including central point A and circumferential edge points B, C, D and E on the surface of GaN substrate 10. Accordingly, microscopic strain in GaN substrate 10 of the first embodiment can be reduced, thus attaining a more uniform microscopic strain distribution. It should be noted that it is more preferable that the value of Δkp (2 mm□) in each of regions 31a, 31b, 31c, 31d, 31e is smaller. For example, in the case of below-mentioned coreless growth rather than facet growth, microscopic strain distribution becomes small but macroscopic strain distribution becomes large, with the result that GaN substrate 10 is likely to be broken or cracked during epitaxial growth of a semiconductor layer on GaN substrate 10. To address this, in GaN substrate 10 of the first embodiment, a microscopic strain distribution as in the facet growth is intentionally produced to suppress increased macroscopic strain distribution, thereby suppressing occurrence of breakage or crack in GaN substrate 10 during epitaxial growth of a semiconductor layer on GaN substrate 10. In order to produce the microscopic strain distribution, Δkp (2 mm□) preferably has a value not less than a certain value, and is preferably set at not less than 0.1 cm$^{-1}$.

Moreover, in GaN substrate 10 of the first embodiment, the difference (Δkp (entire surface)) is not more than 2 cm$^{-1}$ between the maximum and minimum values of the Raman shift amounts corresponding to the $E_2^H$ phonon mode in the Raman spectra at all of the measurement points in regions 31a, 31b, 31c, 31d, 31e. In this way, the macroscopic strain can be reduced in GaN substrate 10 of the first embodiment, thereby attaining a more uniform macroscopic strain distribution.

This is achieved because it has been found, as a result of diligent study by the present inventor, that even when epitaxially growing another semiconductor layer on a GaN substrate having a large-diameter surface having a diameter R of not less than 100 mm, the GaN substrate can be suppressed from being cracked or broken if Δkp (2 mm□) and Δkp (entire surface) are set as described above.

Figure 6:
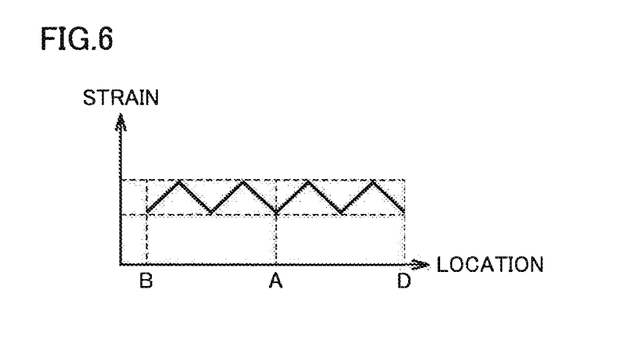
FIG. 6 is a conceptual view of a relation between strain and a location on a straight line passing through points B, A, and D of the GaN substrate of the first embodiment.

FIG. 6 shows a conceptual view of a relation between strain and a location on the straight line passing through points B, A, and D of GaN substrate 10 of the first embodiment. For comparison, FIG. 7 shows a conceptual view of a relation between strain and a location on a straight line passing through points B, A, and D of a conventional GaN substrate.

Figure 7:
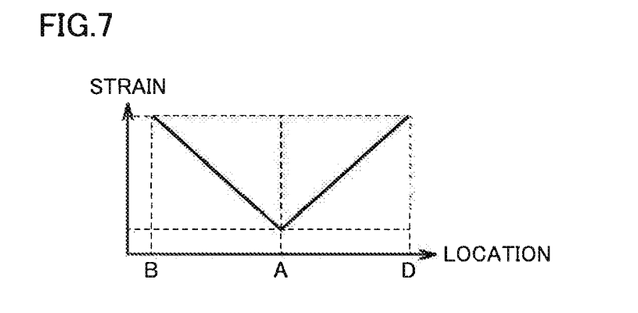
FIG. 7 is a conceptual view of a relation between strain and a location on a straight line passing through points B, A, and D of a conventional GaN substrate.

Apparently from the comparison between FIG. 6 and FIG. 7, it is understood that in GaN substrate 10 of the first embodiment, strain is reduced to be small at any of points B, A, and D and a difference between the magnitude of maximum strain and the magnitude of minimum strain is reduced to be small in the entire GaN substrate as compared with the conventional GaN substrate.

Although the GaN substrate employing the GaN crystal described in Non-Patent Document 1 can be suppressed from being cracked and broken, GaN substrate 10 of the first embodiment provides a more improved effect of suppressing occurrence of crack and breakage because Δkp (2 mm□) and Δkp (entire surface) are set as described above.

It should be noted that the term "crack" refers to a fissure formed in GaN substrate 10 to such an extent that GaN substrate 10 is not divided into plural pieces. On the other hand, the term "breakage" refers to such a state that GaN substrate 10 is fissured and divided into plural pieces.

Second Embodiment

A feature of a GaN substrate 10 of a second embodiment lies in that it is different from the first embodiment in the following points (i) to (iii).

(i) GaN substrate 10 has a surface having a diameter R of not less than 150 mm.

(ii) A difference (Δkp (2 mm□)) is not less than 0.1 cm$^{-1}$ and not more than 1 cm$^{-1}$ between maximum and minimum values of Raman shift amounts corresponding to the $E_2^H$ phonon mode in Raman spectra obtained through micro-Raman scattering mapping measurement in each of square regions 31a, 31b, 31c, 31d, 31e having sides each having a length of 2 mm, the square regions having respective centers at a total of five points including a central point A and circumferential edge points B, C, D and E on the surface of GaN substrate 10.

(iii) A difference (Δkp (entire surface)) is not more than 1 cm$^{-1}$ between maximum and minimum values of the Raman shift amounts corresponding to the $E_2^H$ phonon mode in the Raman spectra at all of the measurement points in regions 31a, 31b, 31c, 31d, 31e.

In the second embodiment, since the lower limit of diameter R of the surface of GaN substrate 10 is larger, i.e., the surface of GaN substrate 10 has a larger diameter, crack and breakage are more likely to occur as compared with the first embodiment. However, also in this case, occurrence of crack and breakage can be suppressed by setting Δkp (2 mm□) at not less than 0.1 cm$^{-1}$ and not more than 1 cm$^{-1}$ and setting Δkp (entire surface) at not more than 1 cm$^{-1}$.

The second embodiment is the same as the first embodiment apart from the above description, and therefore repeated description thereof will not be provided.

Third Embodiment

A feature of a GaN substrate 10 of a third embodiment lies in that a square region having sides each having a length of 2 mm on a surface of GaN substrate 10 include: a region having a threading dislocation density of not less than 1×10$^6$ cm$^{-2}$; and a region having a threading dislocation density of less than 1×10$^6$ cm$^{-2}$. In GaN substrate 10 of the third embodiment, dislocations are located intensively in a region (core portion 12) having a threading dislocation density of not less than 1×10$^6$ cm$^{-2}$, thereby improving crystallinity of the region (facet 13) having a threading dislocation density of less than 1×10$^6$ cm$^{-2}$.

Each square region having sides each having a length of 2 mm on the surface of GaN substrate 10 includes the region having a threading dislocation density of not less than 1×10$^6$ cm$^{-2}$ and the region having a threading dislocation density of less than 1×10$^6$ cm$^{-2}$ as in the third embodiment presumably because the following phenomena (I) to (V) occur in this order in the course of the crystal growth of GaN crystal 11 from FIG. 2B to FIG. 2C.

(I) Threading dislocations are reduced in facets 13 of each depression 14 in the surface of GaN crystal 11 because the dislocations are moved to a boundary between adjacent facets 13.

(II) A defect surface (surface defect portion) is formed because the dislocations are gathered below the boundary between adjacent facets 13 of depression 14 in the surface of GaN crystal 11.

(III) The dislocations are prevented from being expanded by merging and confinement of the dislocations at multiple points at which the plurality of facets 13 of depressions 14 in the surface of GaN crystal 11 cross with one another.

(IV) Line defect portions and core portions 12 above the line defect portions are formed due to the dislocations gathering below the multiple points.

(V) The low defect portions are increased in facets 13 due to growth of facets 13.

The third embodiment is the same as the first embodiment and the second embodiment apart from the above descriptions, and therefore repeated description thereof will not be provided. In other words, GaN substrate 10 of the third embodiment includes not only the region having a threading dislocation density of not less than 1×10$^6$ cm$^{-2}$ and the region having a threading dislocation density of less than 1×10$^6$ cm$^{-2}$, but also the features of GaN substrate 10 of the first embodiment or the second embodiment.

It should be noted that the threading dislocations are dislocations threading in the C axis growth direction, and the threading dislocation density can be evaluated by counting a density of etch pits resulting from selective etching. Examples of the selective etching method include: immersion of the GaN substrate in a heated acid or alkaline aqueous solution; immersion of the GaN substrate in a molten salt of potassium hydroxide (molten KOH); or the like. Moreover, the threading dislocation density can be also measured using cathode luminescence (CL). In the CL, portions with threading dislocations are shown as dark points. Hence, the number of the dark points is counted to determine a density per unit area (1 cm$^2$), thereby measuring the threading dislocation density.

EXAMPLES

Experiment Example 1

First, as shown in FIG. 2A, as growth substrate 21, there was prepared a sapphire substrate having a surface (C plane) 21a having a diameter of 110 mm Next, as shown in FIG. 2B, a SiO$_2$ film having a thickness of 0.1 μm was formed on the C plane of the sapphire substrate through plasma CVD, and then photolithography and etching employing BHF (buffered hydrofluoric acid) were performed to form a patterning layer 22 constituted of a SiO$_2$ film. Patterning layer 22 had such a shape that circles each having a diameter of 50 μm were arranged in the form of a lattice at a pitch of 800 μm, and lattice directions were matched with an m-axis direction and an a-axis direction.

Next, as shown in FIG. 2C, GaN crystal 11 was grown for 10 hours to have a thickness of about 1200 μm, on the C plane of the sapphire substrate having patterning layer 22 formed thereon and serving as growth substrate 21. GaN crystal 11 was grown through HYPE employing metallic Ga as a Ga source material and employing NH$_3$ gas as a N source material.

GaN crystal 11 was grown through HYPE as follows. First, the sapphire substrate serving as growth substrate 21 was placed on a sample holder made of quartz in a hot wall type reactor. Hydrogen chloride (HCl) gas was sprayed to metallic Ga (heated at 800° C.) placed in an upstream-side boat while using hydrogen (H$_2$) gas as a carrier gas. Resulting gallium chloride (GaCl) gas and NH$_3$ gas were supplied for 30 minutes onto the sapphire substrate heated at 500° C., thereby forming a low-temperature GaN buffer layer having a thickness of about 50 nm. Then, the sapphire substrate was heated to attain a temperature of 1000° C. at the center of the sapphire substrate, and GaCl gas (3.06 kPa) and NH$_3$ gas (6.12 kPa) were supplied to the sapphire substrate for 10 hours together with H$_2$ gas serving as a carrier gas. In this way, GaN crystal 11 having a thickness of about 1200 μm was grown. Here, a temperature difference ΔT in the radial direction of the sapphire substrate (temperature difference between the temperature of the center and the temperature of the circumferential edge (location away from the center by a radius of 55 mm)) was 2° C.

Then, the sapphire substrate was removed by grinding the backside surface of GaN crystal 11 having been grown as described above. Next, the surface of GaN crystal 11 was planarized through grinding and was then polished, thereby producing a GaN substrate of experiment example 1 (with a finishing thickness of 500 μm), which was a freestanding GaN substrate having a circular shape with a diameter of 100 mm, having the C plane as a surface, and having a facet structure.

Next, micro-Raman mapping measurement was performed as follows. As a light source, a second harmonic wave laser device with YAG (yttrium aluminum garnet) was used. Laser light having a wavelength of 532 nm was emitted from the laser device, passed through a slit having a width of 100 μm, and was collected by a lens, whereby the light was incident perpendicularly from the front surface side (side opposite to the side from which the sapphire substrate had been removed) of the GaN substrate of experiment example 1.

Here, the laser light was set to have a spot diameter of about 10 μm on the surface of the GaN substrate. Moreover, the laser light was set to have an intensity of 10 mW on the surface of the GaN substrate. Then, micro-Raman scattering mapping measurement for detecting light back-scattered in the C axis direction was performed to measure Raman spectra. The Raman spectra were measured at points (1681 points in each of the regions) located at a pitch of 50 μm in each of square regions 31a, 31b, 31c, 31d, 31e having sides each having a length of 2 mm, the square regions having respective centers at central point A and circumferential points B, C, D, and E in the GaN substrate shown in FIG. 3.

Then, a difference (Δkp (2 mm□)) was determined between maximum and minimum values of wave numbers at the maximum peak of peaks corresponding to the E$_2^H$ phonon mode in the Raman spectra obtained through the micro-Raman scattering mapping measurement in each of square regions 31a, 31b, 31c, 31d, 31e having sides each having a length of 2 mm, the square regions having respective centers at the total of five points including central point A and outer circumferential edge points B, C, D and E in the GaN substrate of experiment example 1. In addition, a difference (Δkp (entire surface)) was determined between maximum and minimum values of the wave numbers at the maximum peak of the peaks corresponding to the $E_2^H$ phonon mode in the Raman spectra at all of the measurement points in regions 31a, 31b, 31c, 31d, 31e. Results thereof are shown in Table 1. It should be noted that a temperature was 20° C. when measuring the Raman spectra. For wave number calibration, a bright line spectrum of Ne lamp was used as a reference line. For each measurement, Ne bright line was measured for correction. Then, in the Raman spectra obtained as described above, the wave numbers at the maximum peak of the peaks corresponding to the $E_2^H$ phonon mode was specified. Moreover, in Table 1, "kp maximum value" represents the maximum value of the wave numbers at the maximum peak of the peaks corresponding to the $E_2^H$ phonon mode, and "kp minimum value" represents the minimum value of the wave numbers at the maximum peak of the peaks corresponding to the $E_2^H$ phonon mode.

Experiment Example 2

A C-plane GaN template substrate was used which had a surface having a diameter of 110 mm and had a GaN film having a thickness of 2 μm and formed through MOCVD on a sapphire substrate serving as growth substrate 21. A patterning layer 22 constituted of a $SiO_2$ film was formed in the same manner as in experiment example 1. A GaN crystal was grown on patterning layer 22 by the same method and under the same conditions as those in experiment example 1 without forming a low-temperature GaN buffer layer. In this way, a GaN substrate of experiment example 2 was produced (with a finishing thickness of 500 μm), which was a freestanding GaN substrate having a circular shape with a diameter of 100 mm, having a C plane as a surface, and having a facet structure.

Then, in the same manner as in experiment example 1, a difference (Δkp (2 mm□)) was determined between maximum and minimum values of wave numbers at the maximum peak of peaks corresponding to the $E_2^H$ phonon mode in the Raman spectra obtained through the micro-Raman scattering mapping measurement in each of square regions 31a, 31b, 31c, 31d, 31e having sides each having a length of 2 mm, the square regions having respective centers at a total of five points including a central point A and outer circumferential edge points B, C, D and E in the GaN substrate of experiment example 2. In addition, a difference (Δkp (entire surface)) was determined between maximum and minimum values of the wave numbers at the maximum peak of the peaks corresponding to the $E_2^H$ phonon mode in the Raman spectra at all of the measurement points in regions 31a, 31b, 31c, 31d, 31e. Results thereof are shown in Table 1.

Experiment Example 3

With the same method and under the same conditions as those in experiment example 1, a low-temperature GaN buffer layer is formed and a GaN crystal is grown on a GaAs substrate serving as growth substrate 21 and having a surface ((111) A plane) having a diameter of 110 mm. In this way, a GaN substrate of experiment example 3 was produced (with a finishing thickness of 500 μm), which was a freestanding GaN substrate having a circular shape with a diameter of 100 mm, having a C plane as a surface, and having a facet structure.

Then, in the same manner as in experiment example 1, a difference (Δkp (2 mm□)) was determined between maximum and minimum values of wave numbers at the maximum peak of peaks corresponding to the $E_2^H$ phonon mode in the Raman spectra obtained through the micro-Raman scattering mapping measurement in each of square regions 31a, 31b, 31c, 31d, 31e having sides each having a length of 2 mm, the square regions having respective centers at a total of five points including a central point A and outer circumferential edge points B, C, D and E in the GaN substrate of experiment example 3. In addition, a difference (Δkp (entire surface)) was determined between maximum and minimum values of the wave numbers at the maximum peak of the peaks corresponding to the $E_2^H$ phonon mode in the Raman spectra at all of the measurement points in regions 31a, 31b, 31c, 31d, 31e. Results thereof are shown in Table 1.

Experiment Example 4

As a substrate, a sapphire substrate having a diameter of 110 mm was used as in experiment example 1. A GaN crystal was grown with the same method and under the same conditions as those in experiment example 1. In this way, a freestanding GaN substrate was produced (with a finishing thickness of 500 μm), which had a circular shape with a diameter of 100 mm, had a C plane as a surface, and had a facet structure. Then, in the same manner as in experiment example 1, Δkp (2 mm□) and Δkp (entire surface) were determined. Results thereof are shown in Table 1.

It should be noted that at an early stage of growth of the GaN crystal, particularly, for 10 minutes after starting the crystal growth, an amount of oxygen included in atmosphere in the crystal growth furnace was set at not more than 100 ppm. Specifically, before starting the growth of the GaN crystal, gases such as $N_2$, $H_2$ and Ar were supplied at a room temperature for not less than 10 minutes to replace the atmosphere in the crystal growth furnace and an oxygen concentration in the crystal growth furnace was monitored using an oxygen concentration detector to set the oxygen concentration at not more than 100 ppm. Also after starting the growth of the GaN crystal, measurement and control were performed to set the oxygen concentration in the crystal growth furnace at not more than 100 ppm.

Experiment Example 5

As a substrate, a C-plane GaN template substrate having a diameter of 110 mm was used as in experiment example 2. A GaN crystal was grown with the same method and under the same conditions as those in experiment example 4 without forming a low-temperature buffer layer. In this way, a freestanding GaN substrate was produced (with a finishing thickness of 500 μm), which had a circular shape with a diameter of 100 mm, had a C plane as a surface, and had a facet structure. Then, in the same manner as in experiment example 1, Δkp (2 mm□) and Δkp (entire surface) were determined. Results thereof are shown in Table 1.

Experiment Example 6

A GaN crystal was grown with the same method and under the same conditions as those in experiment example 1 except that a GaAs substrate having a surface ((111) A plane) with a diameter of 110 mm as in experiment example 3 was used as a substrate and oxygen concentration control was performed at an early stage of growth. In this way, a freestanding GaN substrate was produced (with a finishing thickness of 500 μm), which had a circular shape with a diameter of 100 mm, had a C plane as a surface, and had a facet structure. Then, in the same manner as in experiment example 1, Δkp (2 mm□) and Δkp (entire surface) were determined. Results thereof are shown in Table 1.

Experiment Example 7

A GaN crystal was grown on a GaN substrate serving as growth substrate 21, with the same method and under the same conditions as those in experiment example 5 without forming a low-temperature GaN buffer layer. The GaN substrate was produced with the same method and under the same conditions as those in experiment example 5, and had a surface (C plane) having a diameter of 110 mm. In this way, a GaN substrate of experiment example 7 was produced (with a finishing thickness of 500 μm), which was a freestanding GaN substrate having a circular shape with a diameter of 100 mm, having a C plane as a surface, and having a facet structure. Then, in the same manner as in experiment example 1, Δkp (2 mm□) and Δkp (entire surface) were determined. Results thereof are shown in Table 1.

Evaluation on Epitaxial Growth

MOVPE was employed to form a Schottky barrier diode (SBD) structure through epitaxial growth on each of the GaN substrates of experiment examples 1 to 7 produced as described above. For the SBD structure, an n$^+$ GaN layer and an n GaN layer were grown epitaxially in this order. The n$^+$ GaN layer served as a carrier stop layer, had a carrier concentration of $2\times10^{18}$ cm$^{-3}$, and had a thickness of 1 μm. The n$^-$ GaN layer served as a carrier drift layer, had a carrier concentration of $1\times10^{16}$ cm$^{-3}$, and had a thickness of 5 μm. Epitaxial growth conditions for these layers were as follows: a growth temperature was 1050° C.; TMG (trimethylgallium) and NH$_3$ gas were used as source materials of GaN; and silane (SiH$_4$) gas was used as a source material of silicon (Si) dopant. Then, an external appearance of the surface of each of the GaN substrates of experiment examples 1 to 7 after the epitaxial growth was observed. Results thereof are shown in Table 1.

As shown in Table 1, there were cracks in the surfaces of the GaN substrates of experiment examples 1 to 4 after the epitaxial growth. However, the GaN substrates of experiment examples 5 to 7 were not cracked and broken and had excellent external appearances. It should be noted that the crack herein was defined as a crack having a length of not less than 0.1 mm, which can be recognized by a Nomarski microscope (with a magnification of ×50).

Experiment Example 8

As a growth substrate, a GaN template substrate formed in the same manner as in experiment example 1 was used. Without forming patterning layer 22 constituted of a SiO$_2$ film and low-temperature buffer layer, heating was performed such that the temperature of the center of the GaN template substrate became 1100° C. in order to grow GaN crystal 11 to have a mirror surface, and the GaN template substrate was supplied with GaCl gas (2.40 kPa) and NH$_3$ gas (2.40 kPa) as well as N$_2$ gas serving as a carrier gas. Accordingly, GaN crystal 11 having a thickness of about 1 mm was grown. Then, a process similar to that in experiment example 1 was performed to produce a GaN substrate of experiment example 8 (with a finishing thickness of 500 μm), which was a freestanding GaN substrate having a circular shape with a diameter of 100 mm, having a C plane as a surface, and having a coreless structure (structure having no depression constituted of a core portion and a facet).

Then, in the same manner as in experiment example 1, a difference (Δkp (2 mm□)) was determined between maximum and minimum values of wave numbers at the maximum peak of peaks corresponding to the E$_2^H$ phonon mode in Raman spectra obtained through micro-Raman scattering mapping measurement in each of square regions 31a, 31b, 31c, 31d, 31e having sides each having a length of 2 mm, the square regions having respective centers at a total of five points including a central point A and outer circumferential edge points B, C, D and E in the GaN substrate of experiment example 8. In addition, a difference (Δkp (entire surface)) was determined between maximum and minimum values of the wave numbers at the maximum peak of the peaks corresponding to the E$_2^H$ phonon mode in the Raman spectra at all of the measurement points in regions 31a, 31b, 31c, 31d, 31e. Results thereof are shown in Table 1.

A SBD structure was formed on the GaN substrate of experiment example 8 through epitaxial growth in the same manner as in experiment example 1. However, when the GaN substrate of experiment example 8 was taken out after the epitaxial growth, the GaN substrate of experiment example 8 was broken into pieces. The GaN substrate of experiment example 8 was broken presumably due to stress generated during the epitaxial growth for the SBD structure or during cooling after the epitaxial growth for the SBD structure. It should be noted that experiment examples 5 to 7 are the present examples, whereas experiment examples 1 to 4 and 8 are comparative examples. Moreover, Table 2 shows manufacturing conditions in the methods for manufacturing the GaN substrates of experiment examples 1 to 8.

TABLE 1

| | | Experiment Example 1 | Experiment Example 2 | Experiment Example 3 | Experiment Example 4 | Experiment Example 5 | Experiment Example 6 | Experiment Example 7 | Experiment Example 8 |
|---|---|---|---|---|---|---|---|---|---|
| | Diameter [mm] | 100 | 100 | 100 | 100 | 100 | 100 | 100 | 100 |
| | Crystal Structure | Facet | Facet | Facet | Facet | Facet | Facet | Facet | Coreless |
| Region 31a [cm$^{-1}$] | Kp Maximum Value | 570.24 | 569.31 | 568.77 | 569.45 | 567.71 | 567.25 | 567.32 | 568.14 |
| | Kp Minimum Value | 567.13 | 567.37 | 567.04 | 567.13 | 566.12 | 567.02 | 567.21 | 568.07 |
| | Δkp (2 mm□) | 3.11 | 1.94 | 1.73 | 2.32 | 1.49 | 0.23 | 0.11 | 0.07 |
| Region 31b [cm$^{-1}$] | Kp Maximum Value | 571.48 | 569.82 | 568.93 | 569.95 | 567.59 | 567.93 | 567.55 | 571.31 |
| | Kp Minimum Value | 567.81 | 567.35 | 567.03 | 567.81 | 566.17 | 567.59 | 567.42 | 571.16 |
| | Δkp (2 mm□) | 3.67 | 2.47 | 1.9 | 2.14 | 1.42 | 0.34 | 0.13 | 0.15 |
| Region | Kp Maximum Value | 570.73 | 568.89 | 569.12 | 570.12 | 567.15 | 567.94 | 567.46 | 571.8 |

TABLE 1-continued

|  |  | Experiment Example 1 | Experiment Example 2 | Experiment Example 3 | Experiment Example 4 | Experiment Example 5 | Experiment Example 6 | Experiment Example 7 | Experiment Example 8 |
|---|---|---|---|---|---|---|---|---|---|
| 31c | Kp Minimum Value | 567.57 | 567.01 | 567.09 | 567.63 | 565.68 | 567.63 | 567.33 | 571.65 |
| [cm$^{-1}$] | Δkp (2 mm□) | 3.16 | 1.88 | 2.03 | 2.49 | 1.47 | 0.31 | 0.13 | 0.15 |
| Region | Kp Maximum Value | 571.57 | 569.97 | 569.27 | 569.81 | 567.52 | 567.67 | 567.61 | 571.52 |
| 31d | Kp Minimum Value | 567.76 | 568.2 | 567.12 | 567.37 | 565.73 | 567.31 | 567.49 | 571.34 |
| [cm$^{-1}$] | Δkp (2 mm□) | 3.81 | 1.77 | 2.15 | 2.44 | 1.79 | 0.36 | 0.12 | 0.18 |
| Region | Kp Maximum Value | 570.93 | 570.02 | 568.92 | 570.07 | 567.57 | 568.12 | 567.63 | 570.87 |
| 31e | Kp Minimum Value | 567.72 | 567.87 | 567.16 | 567.62 | 565.78 | 567.76 | 567.51 | 570.71 |
| [cm$^{-1}$] | Δkp (2 mm□) | 3.21 | 2.15 | 1.76 | 2.45 | 1.79 | 0.36 | 0.12 | 0.16 |
|  | Δkp (Entire Surface) [cm$^{-1}$] | 4.44 | 3.01 | 2.24 | 2.99 | 1.93 | 1.1 | 0.42 | 3.73 |
|  | External Appearance after Epitaxial Growth | Crack | Crack | Crack | Crack | Excellent | Excellent | Excellent | Breakage |

TABLE 2

|  | Experiment Example 1 | Experiment Example 2 | Experiment Example 3 | Experiment Example 4 | Experiment Example 5 | Experiment Example 6 | Experiment Example 7 | Experiment Example 8 |
|---|---|---|---|---|---|---|---|---|
| Oxygen Concentration Control | Not Controlled | Not Controlled | Not Controlled | Controlled | Controlled | Controlled | Controlled | Controlled |
| Sample Holder | Quartz | Quartz | Quartz | Quartz | Quartz | Quartz | Quartz | Quartz |
| Growth Substrate | Sapphire | GaN Template | GaAs | Sapphire | GaN Template | GaAs | GaN | GaN Template |
| Depression Pattern | Dot | Dot | Dot | Dot | Dot | Dot | Dot | None |
| ΔT[° C.] | 2 | 2 | 2 | 2 | 2 | 2 | 2 | 2 |
| T[° C.] | 1000 | 1000 | 1000 | 1000 | 1000 | 1000 | 1000 | 1100 |
| GaCl Partial Pressure [kPa] | 3.06 | 3.06 | 3.06 | 3.06 | 3.06 | 3.06 | 3.06 | 2.40 |
| NH$_3$ Partial Pressure [kPa] | 6.12 | 6.12 | 6.12 | 6.12 | 6.12 | 6.12 | 6.12 | 2.40 |
| Formation of Low-Temperature Buffer Layer | Formed | Not Formed | Formed | Formed | Not Formed | Formed | Not Formed | Not Formed |

Evaluation on GaN Substrates of Experiment Examples 1 to 8

Figure 8:
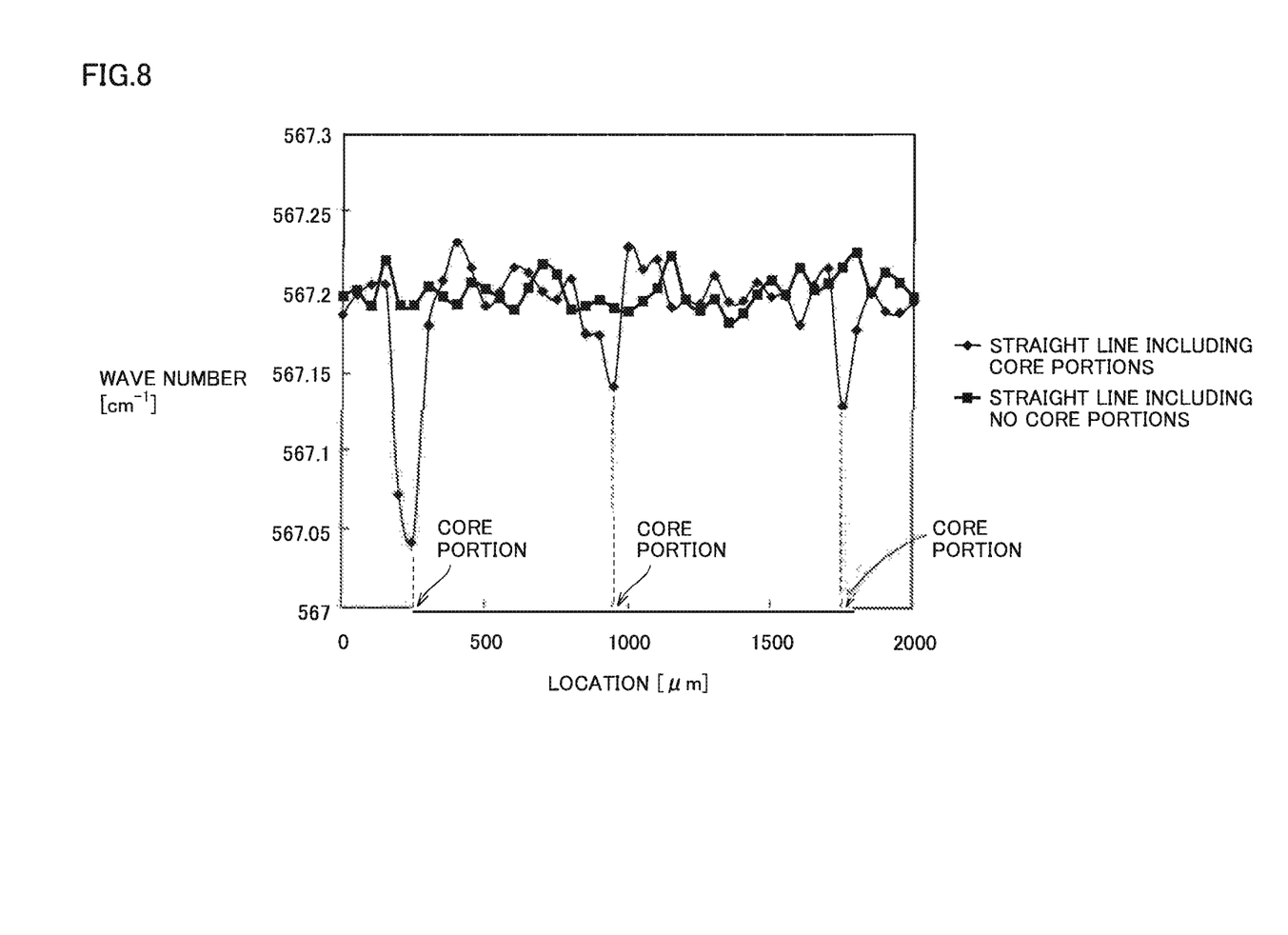
FIG. 8 shows a result of micro-Raman scattering measurement of a GaN substrate of an experiment example 6.

FIG. 8 shows a result of micro-Raman spectrometry of the GaN substrate of experiment example 6. The result of the micro-Raman spectrometry shown in FIG. 8 indicates respective distributions of wave numbers at the maximum peak of the peaks corresponding to the $E_2^H$ phonon mode on a straight line including the core portions and a straight line including no core portions, each of the core portions being a region having dislocations intensively located therein in the square region that had sides each having a length of 2 mm and that had diagonal lines whose intersection was central point A of the surface of the GaN substrate of experiment example 6. As shown in FIG. 8, a distribution in the GaN substrate of experiment example 6 was such that strains were greatly changed in the vicinity of the cores and strains were not greatly changed in regions way from the cores.

As shown in FIG. 8, the wave numbers were changed to be small in the core portions. This means that tensile strains were generated. Although it is unclear what caused the tensile strains in the core portions, the tensile strains were generated presumably due to strains resulting from the dislocations intensively located in the core portions or due to strains resulting from differences between the facet-surface growth region and the C-plane growth region in type and amount of included impurity.

Moreover, micro-Raman scattering mapping measurement was also performed for each of circumferential edge points B, C, D, and E on the surface of the GaN substrate of experiment example 6. As a result, it was confirmed that tendencies similar to that for central point A were exhibited.

From the above result, the microscopic strain distribution is considered to be more dominant than the macroscopic strain distribution in the GaN substrate produced from the GaN crystal having the facet structure including (i) the core portions serving as the regions in which the dislocations were located intensively and (ii) the facets disposed around the core portions and not serving as the regions in which the dislocations were located intensively.

It should be noted that the multiplicity of cracks were generated in the surfaces of the GaN substrates of experiment examples 1 to 4 after the epitaxial growth presumably due to residual strains resulting from the facet structure and thermal strains resulting from the epitaxial growth step because all or part of Δkp (2 mm□) of regions 31a, 31b, 31c, 31d, 31e were more than 2 cm$^{-1}$ in the GaN substrates of experiment examples 1 to 4. In each of the GaN substrates of experiment examples 5 to 7, occurrence of cracks was not observed presumably because Δkp (2 mm□) was relatively small.

Δkp (2 mm□) of each of the GaN substrates of experiment examples 4 to 6 was relatively smaller than that of each of the GaN substrates of experiment examples 1 to 3 employing the similar substrates, presumably because the oxygen concentration in the crystal growth furnace at the early stage of crystal growth was controlled to be low, i.e., not more than 100 ppm. With the low oxygen concentration, it was considered that crystallinity of the GaN crystal at the early stage of crystal growth could be improved to realize the facet structure with a small microscopic strain distribution.

Moreover, Δkp (2 mm□) of the GaN substrate of experiment example 7 was further smaller, presumably due to the control of oxygen concentration at the early stage as well as further reduced defects resulting from employing the GaN substrate as the growth substrate, i.e., homoepitaxial growth.

Moreover, the GaN substrate of experiment example 8 having the coreless structure was broken presumably because the microscopic strain was small ($\Delta$kp (2 mm□) =0.07-0.18 cm$^{-1}$) but the macroscopic strain was large ($\Delta$kp (entire surface)=3.73 cm$^{-1}$) in the GaN substrate. The GaN substrate of experiment example 8 was broken presumably because yield strain of the GaN substrate of experiment example 8 was exceeded by a total strain including residual strain and thermal strain in any of the series of epitaxial growth steps of temperature increase, epitaxial growth, and temperature decrease due to large compressive strain produced macroscopically.

The microscopic strain distribution of the GaN substrate of experiment example 8 was relatively uniform ($\Delta$kp (2 mm□)<0.2 cm$^{-1}$) presumably because regions having dislocations were distributed more uniformly due to absence of the regions in which the dislocations were intensively located. Moreover, the macroscopic strain of the GaN substrate of experiment example 5 was large presumably due to macroscopic strain resulting from stress caused by mismatch in thermal expansion coefficient and mismatch in lattice constant in heteroepitaxial growth.

As described above, considering both the microscopic strain and the macroscopic strain provides an index for defects during epitaxial growth. Quantitively, it is considered that occurrence of crack and breakage can be suppressed during epitaxial growth when $\Delta$kp (2 mm□) of each of regions 31a, 31b, 31c, 31d, 31e is not less than 0.1 cm$^{-1}$ and not more than 2 cm$^{-1}$ and $\Delta$kp (entire surface) is not more than 2 cm$^{-1}$.

Experiment Example 9

A GaAs substrate having a surface ((111) A plane) having a diameter of 160 mm was used as growth substrate 21. With the same method and under the same conditions as those in experiment example 6, a GaN substrate of experiment example 9 was produced (with a finishing thickness of 600 µm), which was a freestanding GaN substrate having a circular shape with a diameter of 150 mm, having a C plane as a surface, and having a facet structure. Here, a temperature difference $\Delta$T in the radial direction (temperature difference between the temperature of the center and the temperature of the circumferential edge (location way from the center by a radius of 75 mm)) was 6° C.

Then, in the same manner as in experiment example 1, a difference ($\Delta$kp (2 mm□)) was determined between maximum and minimum values of wave numbers at the maximum peak of peaks corresponding to the $E_2^H$ phonon mode in Raman spectra obtained through micro-Raman scattering mapping measurement in each of square regions 31a, 31b, 31c, 31d, 31e having sides each having a length of 2 mm, the square regions having respective centers at a total of five points including a central point A and outer circumferential edge points B, C, D and E in the GaN substrate of experiment example 9. In addition, a difference ($\Delta$kp (entire surface)) was determined between maximum and minimum values of the wave numbers at the maximum peak of the peaks corresponding to the $E_2^H$ phonon mode in the Raman spectra at all of the measurement points in regions 31a, 31b, 31c, 31d, 31e. Results thereof are shown in Table 3. It should be noted that circumferential points B, C, D, and E of the GaN substrate of experiment example 9 are located 5 mm away from the outer circumference of a circle constituting the outer circumference of the surface of the GaN substrate of experiment example 9.

All of $\Delta$kp (2 mm□) in regions 31a, 31b, 31c, 31d, 31e of the GaN substrate of experiment example 9 were not more than 2 cm$^{-1}$; however, $\Delta$kp (entire surface) was 2.89 cm$^{-1}$, which was more than 2 cm$^{-1}$, resulting in large macroscopic strain. Accordingly, it was confirmed that the GaN substrate of experiment example 9 was broken when the GaN substrate of experiment example 9 was evaluated in terms of epitaxial growth in the same manner as in experiment examples 1 to 8. This is presumably because the large diameter of the GaN substrate led to an increased maximum value of strain generated in the GaN substrate.

Experiment Example 10

It was considered that the macroscopic strain was increased in the GaN substrate of experiment example 9 due to a large variation in temperature distribution in the radial direction of the growth substrate during the GaN crystal growth. To address this, the material of the sample holder was changed from quartz to silicon carbide (SiC) coated graphite having high thermal conductivity, and temperature difference $\Delta$T was set at 3° C. Apart from these, with the same method and under the same conditions as those for experiment example 9, a GaN substrate of experiment example 10 was produced (with a finishing thickness of 600 µm), which was a freestanding GaN substrate having a circular shape with a diameter of 150 mm, having a C plane as a surface, and having a facet structure.

Then, in the same manner as in experiment example 9, a difference ($\Delta$kp (2 mm□)) was determined between maximum and minimum values of wave numbers at the maximum peak of peaks corresponding to the $E_2^H$ phonon mode in the Raman spectra obtained through the micro-Raman scattering mapping measurement in each of square regions 31a, 31b, 31c, 31d, 31e having sides each having a length of 2 mm, the square regions having respective centers at a total of five points including a central point A and outer circumferential edge points B, C, D and E in the GaN substrate of experiment example 10. In addition, a difference ($\Delta$kp (entire surface)) was determined between maximum and minimum values of the wave numbers at the maximum peak of the peaks corresponding to the $E_2^H$ phonon mode in the Raman spectra at all of the measurement points in regions 31a, 31b, 31c, 31d, 31e. Results thereof are shown in Table 3.

In the GaN substrate of experiment example 10, as compared with the GaN substrate of experiment example 9, both the microscopic strain and the macroscopic strain were small. $\Delta$kp (entire surface) of the GaN substrate of experiment example 10 was 1.5 cm$^{-1}$. It should be noted that the microscopic strain was decreased presumably because thermal strain affecting the GaN crystal was decreased due to the reduced temperature distribution in the radial direction.

When the GaN substrate of experiment example 10 was evaluated in terms of epitaxial growth in the same manner as in experiment examples 1 to 8, the GaN substrate of experiment example 10 was not broken but was cracked particularly at its circumferential edge portion.

Experiment Example 11

As growth substrate 21, the GaN substrate of experiment example 10 was used which was produced with the same method and under the same conditions as those for experiment example 10. With the same method and under the same conditions as those for experiment example 10 except that no low-temperature buffer layer was formed, a GaN substrate of experiment example 11 was produced (with a finishing thickness of 600 μm), which was a freestanding GaN substrate having a circular shape with a diameter of 150 mm, having a C plane as a surface, and having a facet structure.

Then, in the same manner as in experiment example 10, a difference (Δkp (2 mm□)) was determined between maximum and minimum values of wave numbers at the maximum peak of peaks corresponding to the $E_2^H$ phonon mode in Raman spectra obtained through micro-Raman scattering mapping measurement in each of square regions 31a, 31b, 31c, 31d, 31e having sides each having a length of 2 mm, the square regions having respective centers at a total of five points including a central point A and outer circumferential edge points B, C, D and E in the GaN substrate of experiment example 11. In addition, a difference (Δkp (entire surface)) was determined between maximum and minimum values of the wave numbers at the maximum peak of the peaks corresponding to the $E_2^H$ phonon mode in the Raman spectra at all of the measurement points in regions 31a, 31b, 31c, 31d, 31e. Results thereof are shown in Table 3.

In the GaN substrate of experiment example 11, as compared with the GaN substrate of experiment example 10, improvement was achieved with regard to the macroscopic strain. Δkp (entire surface) of the GaN substrate of experiment example 11 was 0.93 cm$^{-1}$. It should be noted that the improvement was achieved with regard to the macroscopic strain presumably because mechanical strain in the GaN substrate of experiment example 11 in relation with the mismatch in thermal expansion coefficient with that of the growth substrate could be reduced.

When the GaN substrate of experiment example 11 was also evaluated in terms of epitaxial growth in the same manner, the GaN substrate of experiment example 11 was not cracked or broken, thus obtaining an excellent result.

It should be noted that experiment example 11 is the present example, whereas experiment examples 9 and 10 are comparative examples. Moreover, Table 4 shows manufacturing conditions in the method for manufacturing the GaN substrates of experiment examples 9 to 11.

TABLE 3

| | | Experiment Example 9 | Experiment Example 10 | Experiment Example 11 |
|---|---|---|---|---|
| | Diameter [mm] | 150 | 150 | 150 |
| | Crystal Structure | Facet | Facet | Facet |
| Region 31a [cm$^{-1}$] | Kp Maximum Value | 567.13 | 568.16 | 567.7 |
| | Kp Minimum Value | 566.22 | 567.55 | 567.47 |
| | Δkp (2 mm□) | 0.91 | 0.61 | 0.23 |
| Region 31b [cm$^{-1}$] | Kp Maximum Value | 569.11 | 568.92 | 568.21 |
| | Kp Minimum Value | 567.88 | 568.29 | 567.76 |
| | Δkp (2 mm□) | 1.23 | 0.63 | 0.45 |
| Region 31c [cm$^{-1}$] | Kp Maximum Value | 569.07 | 568.82 | 568.18 |
| | Kp Minimum Value | 567.81 | 568.19 | 567.72 |
| | Δkp (2 mm□) | 1.26 | 0.63 | 0.46 |
| Region 31d [cm$^{-1}$] | Kp Maximum Value | 568.99 | 569.01 | 568.4 |
| | Kp Minimum Value | 567.71 | 568.39 | 567.92 |
| | Δkp (2 mm□) | 1.28 | 0.62 | 0.48 |
| Region 31e [cm$^{-1}$] | Kp Maximum Value | 568.85 | 569.05 | 568.15 |
| | Kp Minimum Value | 567.58 | 568.23 | 567.71 |
| | Δkp (2 mm□) | 1.27 | 0.82 | 0.44 |
| | Δkp (Entire Surface) [cm$^{-1}$] | 2.89 | 1.5 | 0.93 |
| | External Appearance after Epitaxial Growth | Breakage | Crack | Excellent |

TABLE 4

| | Experiment Example 9 | Experiment Example 10 | Experiment Example 11 |
|---|---|---|---|
| Oxygen Concentration Control | Controlled | Controlled | Controlled |
| Sample Holder | Quartz | SiC | SiC |
| Growth Substrate | GaAs | GaAs | GaN |
| Depression Pattern | Dot | Dot | Dot |
| ΔT [° C.] | 6 | 3 | 3 |
| T [° C.] | 1000 | 1000 | 1000 |
| GaCl Partial Pressure [kPa] | 3.06 | 3.06 | 3.06 |
| NH$_3$ Partial Pressure [kPa] | 6.12 | 6.12 | 6.12 |
| Formation of Low-Temperature Buffer Layer | Formed | Formed | Not Formed |

Evaluation on GaN Substrates of Experiment Examples 9 to 11

In the GaN substrate having the surface having a diameter of 100 mm, the excellent result was obtained when Δkp (entire surface) was not more than 2 cm$^{-1}$ (experiment examples 5 to 7); however, the GaN substrate having the surface having a diameter of 150 mm was cracked even when Δkp (entire surface) was 1.5 cm$^{-1}$ (experiment example 10). The excellent result was obtained, i.e., the GaN substrate was not cracked or broken when Δkp (entire surface) was 0.93 cm$^{-1}$ (experiment example 11). Thus, the value of Δkp (entire surface), which serves as an index for absence of crack and breakage, differs between a case where the diameter is 100 mm and a case where the diameter is 150 mm, presumably because thermal stress during epitaxial growth of another semiconductor layer on the GaN substrate results from temperature distribution (temperature difference) in the GaN substrate. As the diameter of the surface of the GaN substrate becomes larger, it becomes much more difficult to reduce the temperature difference in the surface of the GaN substrate in order to reduce thermal stress generated in the GaN substrate (generally, thermal stress generated in a GaN substrate is proportional to about the square of the diameter of the surface of the GaN substrate. The GaN substrate having a diameter of 150 mm has thermal stress twice or more than twice as large as that of the GaN substrate having a diameter of 100 mm.).

Hence, the GaN substrate is less likely to be cracked during epitaxial growth of another semiconductor layer on the GaN substrate by decreasing the residual strain of the GaN substrate as the diameter of the surface of the GaN substrate is larger. In order to reduce occurrence of crack and breakage during the epitaxial growth, it is considered preferable that Δkp (entire surface) is not more than 1 cm$^{-1}$ in the GaN substrate having a diameter of 150 mm.

Experiment Example 12

The threading dislocation density of a GaN substrate produced in the same manner as in experiment example 5 was evaluated by way of etch pits. A solution of H$_2$SO$_4$:H$_3$PO$_3$=1:1 was heated at 250° C., the GaN substrate was immersed therein for about 30 minutes, and an etch pit density was measured using an optical microscope. The etch pits in the central portion of the GaN substrate were in a high density in the vicinity of the core, and were in a low density at a region away from the core. In a region with a radius of 50 μm from the core as its center, the etch pit density was not less than 1×10$^7$ cm$^{-2}$ (pits were continuous without interruption). In a region with a radius of 400 μm therefrom excluding the region with a radius of 50 μm from the core as its center, the etch pit density was $3 \times 10^5$ cm$^{-2}$. A similar distribution of etch pit density was also obtained in GaN substrates produced in the same manner as in experiment examples 6, 7, and 11, i.e., the etch pit density was not less than $1 \times 10^6$ cm$^{-2}$ in a region with a radius of 50 μm from the core as its center, whereas the etch pit density was less than $1 \times 10^6$ cm$^{-2}$ in a region with a radius of 400 μm therefrom excluding the region with a radius of 50 μm from the core as its center.

Experiment Example 13

An oxygen concentration distribution in a GaN substrate produced under the same conditions as those in experiment example 5 was evaluated using secondary ion mass spectroscopy (SIMS). The oxygen concentration was $2 \times 10^{18}$ cm$^{-3}$ in the facet growth region in the vicinity of the core, and the oxygen concentration was $3 \times 10^{16}$ cm$^{-3}$ in the C plane growth region distant from the core (intersection of diagonal lines of 800 μm☐ through cores at four corners). Also, in a GaN substrate produced in the same manner as in experiment examples 6, 7, and 11, the oxygen concentration was not less than $5 \times 10^{17}$ cm$^{-3}$ in the facet growth region and the oxygen concentration was less than $5 \times 10^{17}$ cm$^{-3}$ in the C plane growth region.

Heretofore, the embodiments and experiment examples of the present invention have been illustrated, but it has been initially expected to appropriately combine configurations of the embodiments and experiment examples.

The embodiments and experiment examples disclosed herein are illustrative and non-restrictive in any respect. The scope of the present invention is defined by the terms of the claims, rather than the embodiments and experiment examples described above, and is intended to include any modifications within the scope and meaning equivalent to the terms of the claims.

INDUSTRIAL APPLICABILITY

The GaN substrates of the embodiments and experiment examples can be used for semiconductor devices such as SBD.

REFERENCE SIGNS LIST

10: GaN substrate; 11: GaN crystal; 21: growth substrate; 21a: surface; 22: patterning layer; 23: threading dislocation; 24: supporting substrate; 25: bonded substrate; 30: orientation flat; 31a, 31b, 31c, 31d, 31e: region; 32: imaginary circle.

The invention claimed is:

1. A gallium nitride substrate comprising a surface, a difference being not less than 0.1 cm$^{-1}$ and not more than 2 cm$^{-1}$ between maximum and minimum values of wave numbers at a maximum peak of peaks corresponding to an $E_2^H$ phonon mode in micro-Raman scattering mapping measurement at each of square regions having sides each having a length of 2 mm, the square regions being located at a total of five locations including a central location and four circumferential edge locations on the surface of the gallium nitride substrate,
a difference being not less than 0.93 cm$^{-1}$ and not more than 2 cm$^{-1}$ between maximum and minimum values of the wave numbers at the maximum peak of the peaks corresponding to the $E_2^H$ phonon mode at all of measurement points in the five locations,
wherein each of the square regions having the sides each having the length of 2 mm on the surface of the gallium nitride substrate includes: a first region and a second region, an oxygen concentration of the first region being higher than an oxygen concentration of the second region,
the first region includes a core portion being a region having dislocations intensively located therein, the second region being located away from the core portion.

2. The gallium nitride substrate according to claim 1, wherein the first region has a threading dislocation density of not less than $1 \times 10^6$ cm$^{-2}$; and the second region has a threading dislocation density of less than $1 \times 10^6$ cm$^{-2}$.

3. A bonded substrate in which the gallium nitride substrate recited in claim 1 is bonded to a supporting substrate.

4. The gallium nitride substrate according to claim 1, wherein the difference at each of the five locations is not less than 0.11 cm$^{-1}$ and not more than 1.79 cm$^{-1}$.

5. The gallium nitride substrate according to claim 1, wherein the difference at all of the five locations is not more than 1.93 cm$^{-1}$.

* * * * *